United States Patent
Muramatsu et al.

(10) Patent No.: US 7,274,395 B2
(45) Date of Patent: Sep. 25, 2007

(54) MOS-TYPE IMAGE SENSOR CONFIGURED TO REDUCE COUPLING NOISE

(75) Inventors: Yoshinori Muramatsu, Tokyo (JP); Hiroaki Ohkubo, Tokyo (JP)

(73) Assignee: NEC Electronics Corporation, Tokyo (JP)

( * ) Notice: Subject to any disclaimer, the term of this patent is extended or adjusted under 35 U.S.C. 154(b) by 644 days.

(21) Appl. No.: 10/012,405

(22) Filed: Dec. 12, 2001

(65) Prior Publication Data

US 2002/0075390 A1    Jun. 20, 2002

(30) Foreign Application Priority Data

Dec. 20, 2000   (JP)   ............... 2000-387134

(51) Int. Cl.
*H04N 3/14*   (2006.01)
(52) U.S. Cl. .................... 348/302; 348/308
(58) Field of Classification Search ............ 348/302, 348/308
See application file for complete search history.

(56) References Cited

U.S. PATENT DOCUMENTS

| | | | |
|---|---|---|---|
| 5,115,293 A * | 5/1992 | Murayama et al. | 257/292 |
| 5,614,744 A | 3/1997 | Merrill | |
| 5,942,774 A * | 8/1999 | Isogai et al. | 257/292 |
| 6,097,022 A * | 8/2000 | Merrill et al. | 250/208.1 |
| 6,573,169 B2 * | 6/2003 | Noble et al. | 438/592 |
| 6,611,013 B2 * | 8/2003 | Rhodes | 257/292 |
| 6,650,369 B2 * | 11/2003 | Koizumi et al. | 348/301 |
| 2001/0000068 A1 * | 3/2001 | Isogai et al. | 257/443 |
| 2003/0137594 A1 * | 7/2003 | Koizumi et al. | 348/308 |

FOREIGN PATENT DOCUMENTS

JP   2000-286405 A   10/2000

OTHER PUBLICATIONS

E. R. Fossum, "Active Pixel Sensors: Are CCD's Dinosaurs?", /SPIE vol. 1990, (1993), pp. 2-14 with Abstract.
S. K. Mendis, et al.; "A 128×128 CMOS Active Pixel Image Sensor for Highly Integrated Imaging Systems"; Dec. 5, 1993; pp. 583-586.

* cited by examiner

*Primary Examiner*—Vivek Srivastava
*Assistant Examiner*—James M. Hannett
(74) *Attorney, Agent, or Firm*—Sughrue Mion, PLLC

(57) ABSTRACT

An image sensor is disclosed that prevents a photoelectrically-converted signal from being corrupted during a readout operation. The image sensor includes a line-selection line located on an upper side of a pixel relative to a top to bottom scan direction and disposed across the pixel in a direction substantially perpendicular to the top to bottom scanning direction. A signal reset line is located on a lower side of the pixel relative to a top to bottom scan direction and is disposed across the pixel in a direction substantially perpendicular to the top to bottom scanning direction. The line-selection line and the signal-reset line are disposed above and below a photoelectric conversion portion of the pixel.

8 Claims, 2 Drawing Sheets

MOS-TYPE IMAGE SENSOR CONFIGURED TO REDUCE COUPLING NOISE

BACKGROUND OF THE INVENTION

1. Field of the Invention

The present invention relates generally to a MOS-type image sensor, and particularly to a MOS-type image sensor configured to reduce the influence of coupling noise between signal wires during operation. The present application is based on Japanese Patent Application No. 0387134/2000, which is incorporated herein by reference.

2. Description of the Related Art

A MOS-type image sensor may be manufactured using a standard MOS manufacturing process, which is different from a CCD image sensor, for example, which requires a special manufacturing process. MOS-type image sensors have recently received attention due to properties such as low power requirements as a result of low-voltage/single-power-source operation and ease of single chip fabrication for peripheral logic and macro circuits.

FIG. 1 illustrates a schematic diagram of a pixel portion for a MOS-type image sensor of the related art. The term pixel denotes a minimum unit and represent a point on a screen display, which is also called a picture element. In FIG. 1, the pixel portion includes a photodiode 31 that photoelectrically converts a received light input into an electric signal, a reset transistor 32 for initializing a potential at a cathode part of the photodiode 31, a transistor 33 for amplifying a signal photoelectrically converted by the photodiode 31, and a line selection transistor 34 for reading out the signal amplified by the transistor 33.

FIG. 2 illustrates a readout timing waveform chart for the MOS-type image sensor shown in FIG. 1. The signal-reset line 41 in FIG. 1 is activated to initialize the cathode part of the photodiode 31 and the pixel begins its exposure cycle. After a lapse of an arbitrary exposure time, the line-selection line 42 shown in FIG. 1 is activated and a signal that is photoelectrically converted in response to the amount of a light exposure is read out. While the time the line-selection line 42 is activated, the signal-reset line 41 is also temporarily activated. The line-selection line 42 remains activated during the activation of the signal-reset line 41. Hence, an initialized signal in the cathode part of the photodiode is successively readout. This operation is used for signal correction based on a reference signal inherent in each pixel.

The above-described operation is repeated for all pixels of a display in the order of the scanning direction, for example, from the top line to the lowest line, so that a picture signal for one frame is readout. In addition, upon reaching the lowest line, the scanning may again be successively repeated from the top line. Thus, it is possible to obtain a moving picture signal for a plurality of frames. In this case, for an arbitrary line, it is also possible to obtain an electronic shutter effect by activating only the signal-reset line 41 temporarily in an arbitrary time period from readout of a present frame to readout of the next frame. Thus, it is possible to obtain an electronic shutter effect that makes exposure time electronically variable.

FIG. 3 illustrates a related art example of the layout of a pixel portion in a MOS-type image sensor proposed by E. R. Fossum et al. (E. R. Fossum, SPIE, 1900, p 2-14, 1993). In this example, a signal-reset line R and a line-selection line S are disposed adjacent to each other at one end of a photoelectric conversion portion PG.

In the example shown in FIG. 3, the signal-reset line R and the line-selection line S are disposed adjacent to each other and both the signal-reset line R and the line-selection line S are made from the same wire material and are formed of wires with substantially the same width and thickness. As a result, as shown in FIG. 2, both the signal-reset line R and the line-selection line S are subjected to coupling noise 43 arising from capacitive effects between the wires during the rising and falling edges of each signal. For example, a problem arises if a signal photoelectrically converted in the photoelectric conversion portion PG becomes corrupted when the signal-reset line R malfunctions due to coupling noise 43 during activation of the line-selection line S.

The present invention solves the above-mentioned problems and is intended to provide a MOS-type image sensor configured to prevent a photoelectrically-converted signal from being corrupted during readout operation.

SUMMARY OF THE INVENTION

An exemplary embodiment of a MOS-type image sensor of the present invention is illustrated in FIG. 4 and includes a line-selection line 2 and a signal-reset line 3 oriented in the horizontal direction to cross over pixel 6. The line-selection line 2 is shown located on the upper side of the pixel relative to a scanning direction, represented by a downward arrow on the right-hand side of FIG. 4. The signal-reset line 3 is shown located on the lower side of the pixel relative to the scanning direction. The line-selection line 2 and the signal-reset line 3 are disposed above and below the pixel 6 with a photoelectric conversion portion 5 of the pixel interposed therebetween.

In a preferred exemplary embodiment illustrated in FIG. 4, adjacent pixels are configured so that a first signal-reset line 1 of an upper pixel 8 is proximate to a first line-selection line 2 of a middle pixel 6 with respect to a scanning direction, and a second line-selection line 4 of a lower pixel 9 is proximate to a second signal-reset line 3 of the middle pixel 6. Thus, a signal is already read out from the upper pixel when the lower pixel is selected. In addition, it is preferred to design the line-selection line with a higher resistance than that of the signal-reset line. For example, the line selection line may be constructed using a polycrystalline-polysilicon based wire and the signal-reset line may be constructed using an aluminum-based wire.

A further embodiment of the present invention provides an image sensor comprising a photo diode, a reset transistor resetting a data converted by the photo diode in response to a reset signal, a read out transistor reading the data into a data line in response to a selecting signal, a reset line providing the reset signal with the reset transistor, and a select line providing the selecting signal with the read out transistor, and wherein the photo diode is disposed between the reset line and the select line.

BRIEF DESCRIPTION OF THE DRAWINGS

The above and other objects, advantages, and features of the present invention will be more apparent from the following description taken in conjunction with the accompanying drawings, in which.

BRIEF DESCRIPTION OF THE INVENTION

Figure 1:
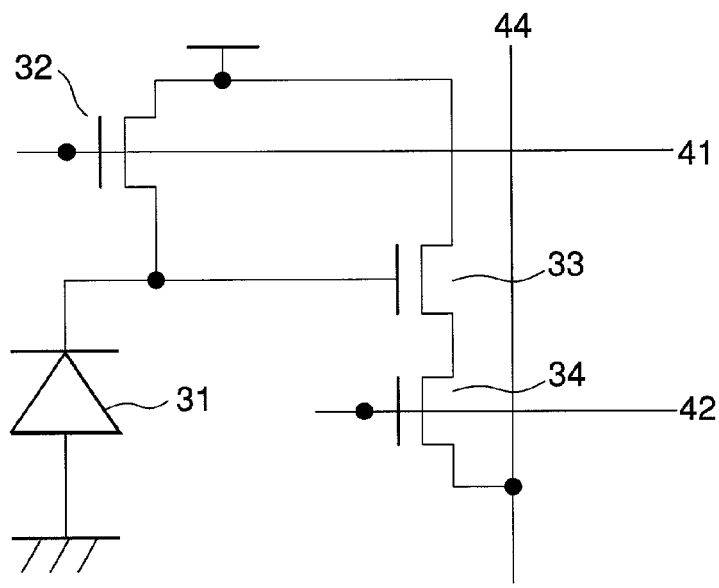
FIG. 1 is a schematic diagram illustrating a circuit of a pixel portion in a MOS-type image sensor.
Figure 2:
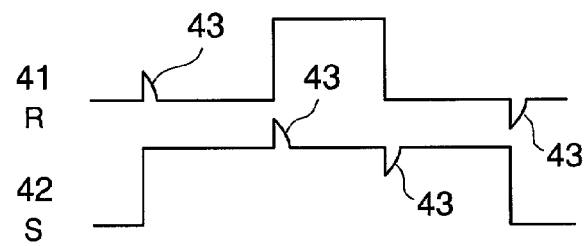
FIG. 2 is a waveform chart showing signal readout timing for the MOS-type image sensor shown in FIG. 1.
Figure 3:
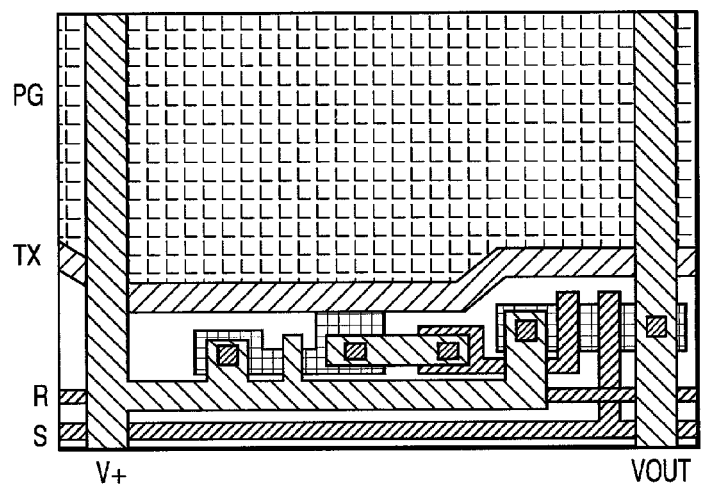
FIG. 3 is a diagram illustrating the layout of a pixel portion in a MOS-type image sensor of the related art.
Figure 4:
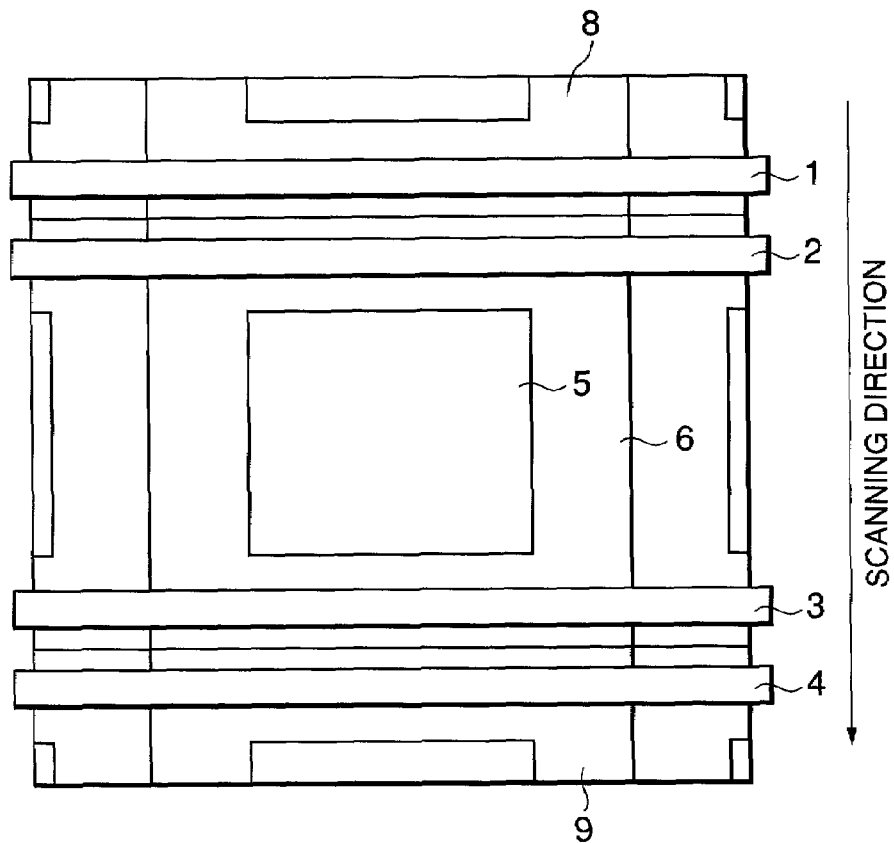
FIG. 4 is a layout diagram illustrating a pixel portion of an embodiment of the present invention.

FIG. 4 is a layout diagram showing a pixel portion of an embodiment of the present invention. Line-selection line 2 and signal-reset line 3 are shown in a horizontal-direction across pixel 6. The line-selection line 2 is on the upper side of pixel 6, with respect to a scanning direction represented by the arrow on the right side of FIG. 4. The signal-reset line 3 is located on the lower side of the pixel 6. They are disposed above and below pixel 6 with a photoelectric conversion portion 5 of the pixel interposed therebetween.

In addition to the line-selection line 2, the signal-reset line 3, and the photoelectric conversion portion 5 shown in FIG. 4, pixel 6 also includes a power source line, a readout line, an amplifier, a reset switch, a selecting switch, and the like, which are not shown. These omitted structures of pixel 6 are well known by those skilled in the art and are not needed to understand the present invention. Thus, their detailed structures are not shown in FIG. 4.

Figure 5:
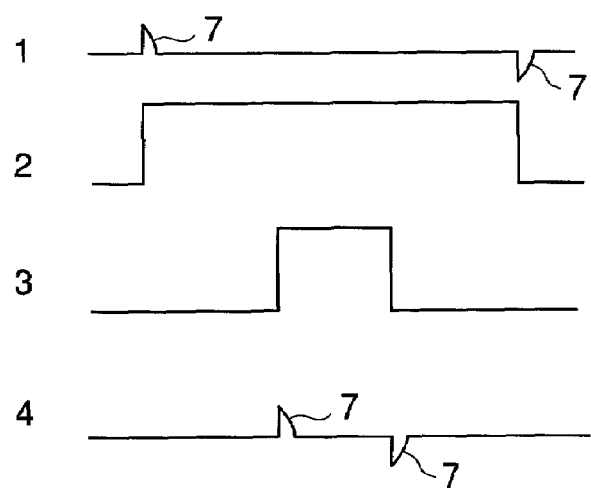
FIG. 5 is a waveform chart showing signal readout timing for the device shown in FIG. 4.

The following description is directed to an exemplary embodiment of the present example. FIG. 5 is a chart showing signal timing in the device shown in FIG. 4. In the MOS-type image sensor, horizontal-direction wires are selected sequentially in the scanning direction, so that signal reset and line selections are performed. As shown in FIG. 5, coupling noise 7 generally occurs at the rising and falling edges of each signal due to the interaction between wires.

In the embodiment illustrated in FIG. 4, the line-selection line 2 and the signal-reset line 3 are disposed apart from each other so that they reside at opposite sides of the photoelectric conversion portion 5 in the pixel 6 with respect to a scanning direction in which the horizontal-direction selection lines are scanned. As a result of the physical separation between the line-selection line 2 and the signal-reset line 3, the electrical interaction is reduced so as to essentially eliminate any coupling noise 7 therebetween.

Regarding adjacent pixels, a signal-reset line 1 of an upper pixel 8 is proximate to the line-selection line 2 of pixel 6, with respect to a scanning direction in which the horizontal-direction selection lines are scanned, as illustrated in FIG. 4. Furthermore, a line-selection line 4 of lower pixel 9 is proximate to the signal-reset line 3 of pixel 6. The close proximity of the adjacent pixel wiring may cause interactive coupling noise 7 during operation. However, as a result of the scanning direction illustrated by the arrow on the right hand side of FIG. 4, a signal from upper-side pixel 8 is readout by the time pixel 6 is selected. Thus, even line-selection line 2 causes coupling noise 7 in the signal-reset line 1, this does not adversely affect an image, for example, reading out a one-scene still picture or reading out a moving picture using an electronic shutter together. During the reading of pixel 6, a signal has not yet been readout from the lower-side pixel 9. Therefore, even if the coupling noise 7 occurs in the line-selection line 4, the signal of the pixel 9 that has not been subjected to read out cannot be corrupted.

On the other hand, the line-selection line 2 may be located on the lower side of the pixel 6, with respect to a scanning direction in which the horizontal-direction selection lines are scanned, and the signal-reset line 3 may be located on the upper side of the pixel 6. However, if these lines are disposed in this manner to interpose a photoelectric conversion portion, then a coupling noise may occur in the signal-reset line of a pixel that has not been subjected to readout. This may cause the signal photoelectrically converted by the photoelectric conversion portion to become corrupted prior to being readout.

In another exemplary embodiment of the present invention having a basic structure similar to the first embodiment, the line-selection line 2 is provided with a higher resistance than that of the signal-reset line 3. This can be achieved, for example, by using a polycrystalline-polysilicon based wire for the line-selection line 2 and an aluminum-based wire for the signal-reset line 3. This embodiment reduces the coupling noise 7 with respect to the signal-reset line 1 and it reduces a problem in reading out a moving picture using no electronic shutter.

For the above-mentioned embodiments, the line-selection line 2 and the signal-reset line 3 are preferably arranged in a same layer to reduce the number of wiring layers. However, the present invention is not limited to this configuration, and the line-selection line 2 and the signal-reset line 3 may be formed by wires located in different layers. Furthermore, although an aluminum-based material is generally contemplated, other electroconductive materials may be used.

According to the present invention, a line-selection line 2 and a signal-reset line 3 are disposed horizontally across a pixel 6 with respect to a scanning direction. Line-selection line 2 is located on the upper side of pixel 6 and the signal-reset line 3 is located on the lower side of the pixel 6, with respect to a scanning direction in which the horizontal-direction selection lines are scanned. They are disposed above and below the pixel 6 to interpose a photoelectric conversion portion 5. Thus, even if coupling noise is caused by the wires during operation, the problem of signal corruption does not arise.

For instance, even when coupling noise occurs in the signal-reset line, a signal has already been readout from the upper-side pixel, and thus no problem is caused in reading out a one-scene still picture and in reading out a moving picture using an electronic shutter together. In addition, even if the coupling noise occurs in the line-selection line, the signal of the pixel that has not yet been subjected to readout cannot be corrupted.

The present invention is not limited to the above embodiments, and it is contemplated that numerous modifications may be made without departing from the spirit and scope of the invention. The pixel structure, as described above with reference to the figures, is a merely an exemplary embodiment of the invention, and the scope of the invention is not limited to these particular embodiments. Accordingly, other structural configurations may be used, without departing from the spirit and scope of the invention.

What is claimed is:

1. A MOS-type image sensor comprising:
a first photodiode;
a second photodiode;
a first line-selection line provided for said first photodiode;
a first signal-reset line provided for said first photodiode;
a second line-selection line provided for said second photodiode; and
a second signal-reset line provided for said second photodiode;
said first line-selection line, said first signal-reset line, said second line-selection line and said second signal-reset line being arranged substantially parallel to one another, said first photodiode being positioned between said first line-selection line and said first signal-reset line, said second photodiode being positioned between said second line-selection line and said second signal-reset line, said first signal-reset line and said second line-selection line being positioned between said first photodiode and said second photodiode, wherein said first photodiode is scanned to read out electric charges therefrom before said second photodiode is scanned to read out electric charges therefrom.

2. The MOS-type image sensor according to claim 1, wherein said first signal-reset line is activated before said first line-selection line is activated, and thereafter said second signal-reset line is activated before said second line-selection line is activated.

3. The MOS-type image sensor according to claim 2, further comprising:

a data line;

a power supply line;

a first select transistor coupled between said data line and said first photodiode and turned on in response to activation of said first line-selection line;

a first reset transistor coupled between said power supply line and said first photodiode and turned on in response to activation of said first signal-reset line;

a second select transistor coupled between said data line and said second photodiode and turned on in response to activation of said second line-selection line; and a second reset transistor coupled between said power supply line and said second photodiode and turned on in response to activation of said second signal-reset line, wherein said first reset transistor is turned on before said first select transistor is turned on, and thereafter said second reset transistor is turned on before said second select transistor is turned on.

4. The MOS-type image sensor according to claim 1, wherein each of said first and second line-selection line is higher in resistivity than each of said first and second signal-reset line.

5. The MOS-type image sensor according to claim 4, wherein each of said first and second line-selection line is made of polysilicon and each of said first and second signal-reset line is made of aluminum.

6. A MOS-type image sensor, comprising:

a plurality of photodiodes arranged in a plurality of rows and columns;

a plurality of pairs of a line-selection line and a signal-reset line elongated substantially parallel to one another, each of said pairs being provided for an associated one of said rows to sandwich the photodiodes arranged in the associated one of said rows therebetween, the signal-reset line provided for one of an adjacent two of said rows and the line-selection line provided for the other of the adjacent two of said rows being sandwiched between the photodiodes arranged in the adjacent two of said rows, and the photodiodes arranged in said one of the adjacent two of said rows being scanned to read out electric charges therefrom, followed by scanning the photodiodes arranged in said other of the adjacent two of rows to read out electric charges therefrom.

7. The MOS-type image sensor according to claim 6, wherein said line-selection line is higher in resistivity than said signal-reset line.

8. The MOS-type image sensor according to claim 7, wherein said line-selection line is made of polysilicon and said signal-reset line is made of aluminum.

* * * * *